(12) United States Patent
Wang et al.

(10) Patent No.: US 7,363,640 B2
(45) Date of Patent: Apr. 22, 2008

(54) MOUNTING APPARATUS FOR DATA STORAGE DEVICES

(75) Inventors: Liang Chin Wang, Tu-Chen (TW); Li-Ping Chen, Tu-Chen (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 465 days.

(21) Appl. No.: 10/946,449

(22) Filed: Sep. 20, 2004

(65) Prior Publication Data

US 2005/0066346 A1 Mar. 24, 2005

(30) Foreign Application Priority Data

Sep. 19, 2003 (TW) .............................. 92216898 U

(51) Int. Cl.
*G11B 33/02* (2006.01)
(52) U.S. Cl. .................... 720/657; 361/684; 361/726
(58) Field of Classification Search ............. 360/97.02; 720/654, 657; 248/200, 674; 369/263.1; 361/726, 727; 312/223.1, 223.2
See application file for complete search history.

(56) References Cited

U.S. PATENT DOCUMENTS 4,713,714 A * 12/1987 Gatti et al. ................. 360/137
5,564,804 A * 10/1996 Gonzalez et al. ........ 312/223.2
5,836,562 A * 11/1998 Danzyger et al. ...... 248/295.11
6,469,889 B1 * 10/2002 Gan .......................... 361/685

FOREIGN PATENT DOCUMENTS

| TW | 285393 | 4/1992 |
| TW | 190919 | 9/1992 |
| TW | 224797 | 6/1994 |

* cited by examiner

*Primary Examiner*—Andrea Wellington
*Assistant Examiner*—Carlos E Garcia
(74) *Attorney, Agent, or Firm*—Wei Te Chung

(57) ABSTRACT

A mounting apparatus includes a bracket (20), a first rail member (30) and a second rail member (40) to secure a storage device (10) therein. The bracket comprises a first side wall (24) and a second side wall (26) each defining a slot (241, 261) therein. A protrusion (266) protrudes outwardly from each of the first and second side walls of the bracket. The first and second rail members are attached to both sidewalls of the data storage device. Each of the rail members comprises a body (32, 42) and a hook (342, 442) formed at an end thereof. A pair of posts (324, 428) protrudes outwardly from the body. The posts slide in the slots of the bracket, till the hooks of the rail members hook the protrusions of the first and second side walls of the bracket. Thus the data storage device is secured in the bracket.

14 Claims, 6 Drawing Sheets

MOUNTING APPARATUS FOR DATA STORAGE DEVICES

BACKGROUND OF THE INVENTION

1. Field of the Invention

The present invention relates to mounting apparatuses, and particularly to a mounting apparatus which readily secures data storages devices therein and allows convenient removal of the data storage devices therefrom.

2. Description of the Related Art

In the enclosure of a typical personal computer, there are generally two disk drive brackets mounted therein. Usually, a variety of disk drives are received in the disk drive brackets, which are then secured into the enclosure. There are many ways to secure the disk drive brackets in the enclosure. One way is by using screws. A pair of joining edges is formed on opposite sides of a bottom of a lower disk drive bracket. Fixing holes are defined in the joining edges. The lower disk drive bracket is secured to a bottom of an upper disk drive bracket by screws. However, this way of securing the disk drive brackets is unduly painstaking and time-consuming. Disassembly of the disk drive brackets is similarly painstaking and time-consuming.

Another way to secure the disk drive brackets in the enclosure is by using hooks. An example of a pertinent mounting apparatus for disk drive devices is disclosed in Taiwan patent application No. 81205427. One side of a first disk drive bracket has a plurality of L-shaped flanges and a plurality of L-shaped projections. A corresponding side of a second disk drive bracket has a plurality of L-shaped projections and a plurality of L-shaped flanges, respectively corresponding to the L-shaped flanges and L-shaped projections of the first disk drive bracket. Each flange fastens to the corresponding projection, thus securing the second disk drive bracket to the first disk drive bracket. This mounting apparatus does not need screws. However, the disk drive brackets must be assembled by hand inside the computer enclosure. Thus makes the assembly operation inconvenient, and increases the risk of accidental damage to other components such as sensitive electronic components inside the computer enclosure.

Thus an improved mounting apparatus which overcomes the above-mentioned problems is desired.

SUMMARY OF THE INVENTION

Accordingly, an object of the present invention is to provide a mounting apparatus which readily secures data storages devices therein and allows convenient removal of the data storage devices therefrom To achieve the above-mentioned object, a mounting apparatus includes a bracket, two rail members to secure a storage device therein. The bracket comprises two side walls each defining a slot therein. A protrusion protrudes outwardly from each of the first and second side walls of the bracket. The first and second rail members are attached to both sidewalls of the data storage device. Each of the rail members comprises a body and a hook formed at an end thereof. A pair of posts protrudes outwardly from the body. The posts slide in the slots of the bracket, till the hooks of the rail members hook the protrusions of the first and second side walls of the bracket. Thus, the data storage device is secured in the bracket.

Other objects, advantages and novel features of the present invention will be drawn from the following detailed description of a preferred embodiment of the present invention with attached drawings, in which:

DETAILED DESCRIPTION OF THE INVENTION

Figure 1:
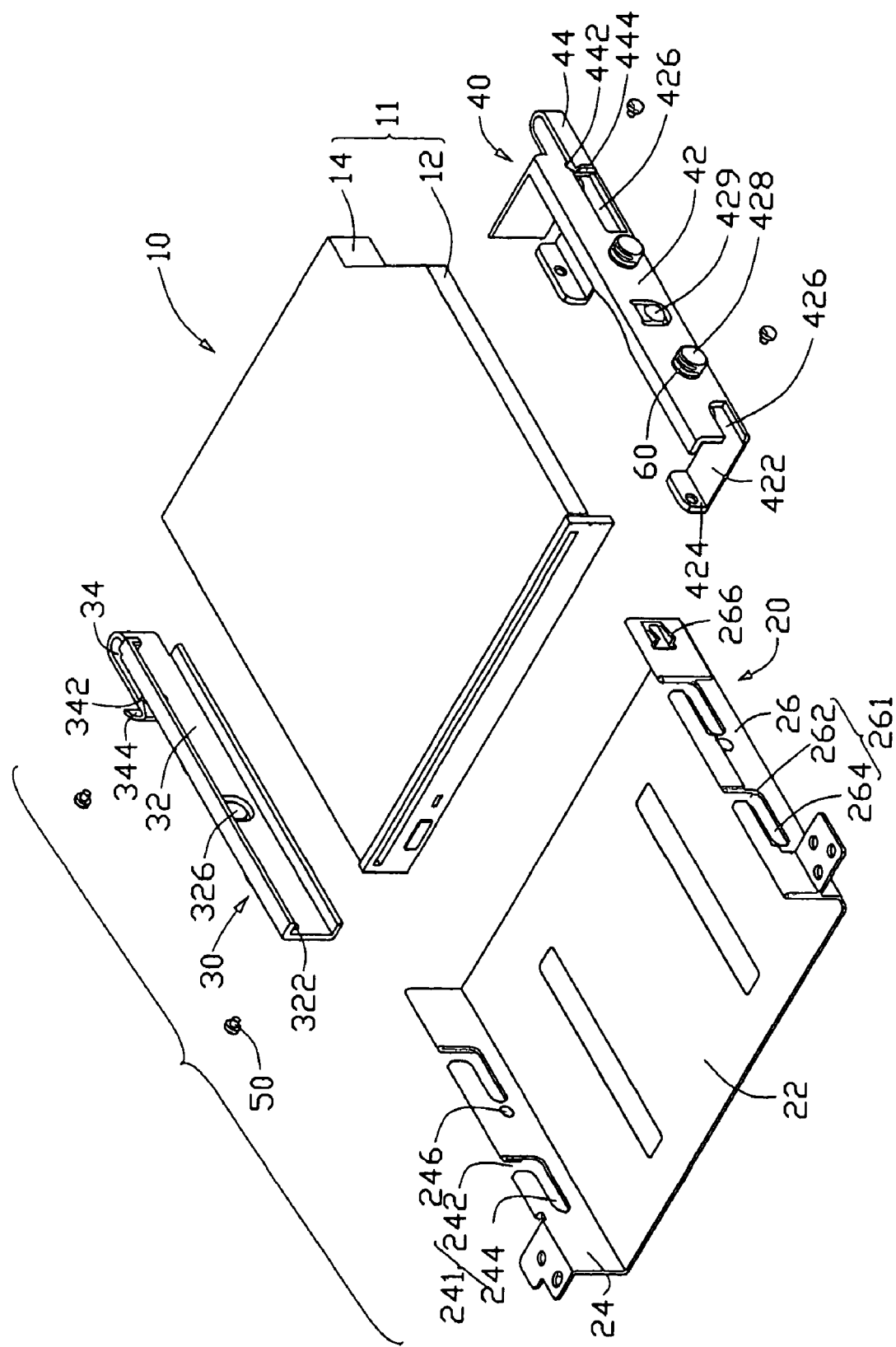
FIG. 1 is an exploded, isometric view of a mounting apparatus in accordance with the preferred embodiment of present invention, together with a data storage device, the mounting apparatus comprising a bracket, a first rail member and a second rail member.

Referring to FIG. 1, a mounting apparatus in accordance with the preferred embodiment of the present invention is used to accommodate a data storage device 10 therein. The mounting apparatus comprises a bracket 20, a first rail member 30 and a second rail member 40.

The data storage device 10 comprises a continuous first sidewall (invisible) and a discontinuous second sidewall 11. The second sidewall 11 comprises a first vertical wall 12 and a second vertical wall 14. A pair of locking holes (invisible) is defined in each of the first sidewall and second vertical wall 14.

The bracket 20 comprises a bottom wall 22, a first side wall 24 and a second side wall 26 extending perpendicular from two opposite sides of the bottom wall 22. Two L-shaped slots 241, 261 are defined in each of the first side wall 24 and second side wall 26. Each of the slots 241,261 comprises a vertical mounting entry part 242 or 262 and a horizontal sliding part 244 or 264. Two recesses 246 are defined in the first side wall 24 and the second side wall 26 respectively. Two triangular protrusions 266 protrude outwardly from an end of the first side wall 24 and second side wall 26 respectively.

The first rail member 30 comprises a first body 32 an a U-shaped bending portion 34 extending outwardly from a distal end of the first body 32 and then overlappingly bent therefrom. A pair of through holes 322 corresponding to the locking holes of the first sidewall of the data storage device 10 is defined in the first body 32. A pair of posts 324 (shown in FIG. 2) protrudes from the first body 32 between the through holes 322 thereof A resilient tab 326 is stamped from the first body 32. A knob (not labeled) is formed from the resilient tab 326 to corresponding to each of the recesses 246 of the bracket 20. A hook 342 protrudes inwardly from the bending portion 34 at a distal end thereof. A handle 344 is bent outwardly from the distal end of the bending portion 34.

The second rail member 40 comprises a second body 42 and a U-shaped bending portion 44 extending outwardly from a distal end of the second body 42 and then overlappingly bent therefrom. A pair of L-shaped locking tabs 422 extends inwardly from a bottom of the second body 42. A through hole 424 is defined in each locking tab 422, corresponding to the locking holes of the second vertical wall 14 of the data storage device 10. Two cutouts 426 are respectively defined in the second body 42 adjacent to the locking tabs 422. A pair of posts 428 protrudes from the second body 42. A resilient tab 429 is stamped from the second body 42, corresponding to the recess 246 of the second side wall 26 of the bracket 20. A hook 442 protrudes inwardly from the bending portion 44 at a distal end. A handle 444 is bent outwardly from the distal end of the bending portion 44.

Figure 2:
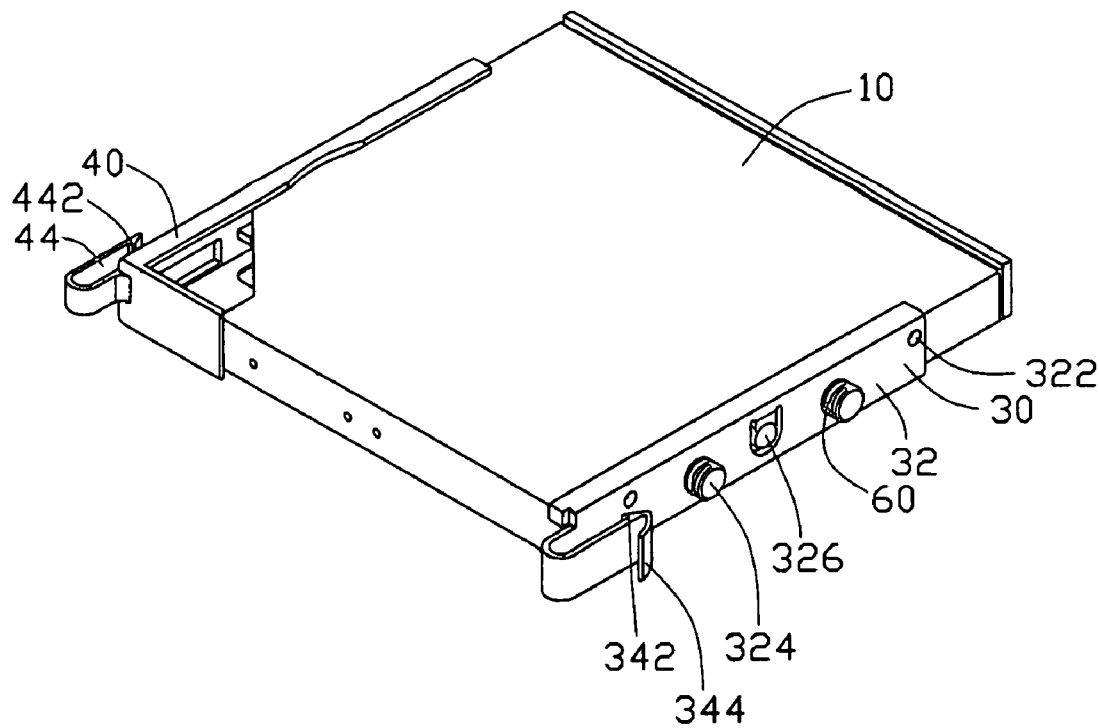
FIG. 2 is an assembled view of the first rail member and second rail member mounted on both sidewalls of the data storage device.
Figure 3:
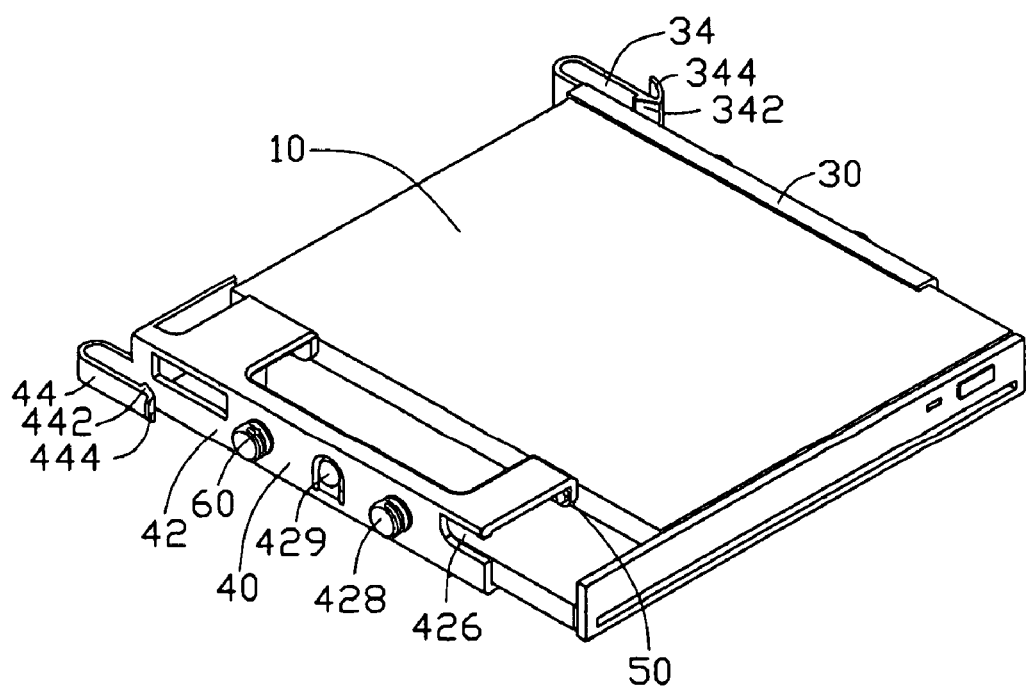
FIG. 3 is similar to FIG. 2, but viewed from another aspect.

Referring to FIGS. 2 and 3, when assembling the first rail member 30 and the second rail member 40 to the data storage device 10, two screws 50 extend through the through holes 322 of the first rail member 30 and engage in the corresponding locking holes of the first sidewall of the data storage device 10. Two screws 50 extend through the through holes 424 of the second rail member 40 and engage in the corresponding locking holes of the second vertical wall of the data storage device 10. Thus, the first rail member 30, the second rail member 40 and the data storage device 10 are combined together.

Figure 4:
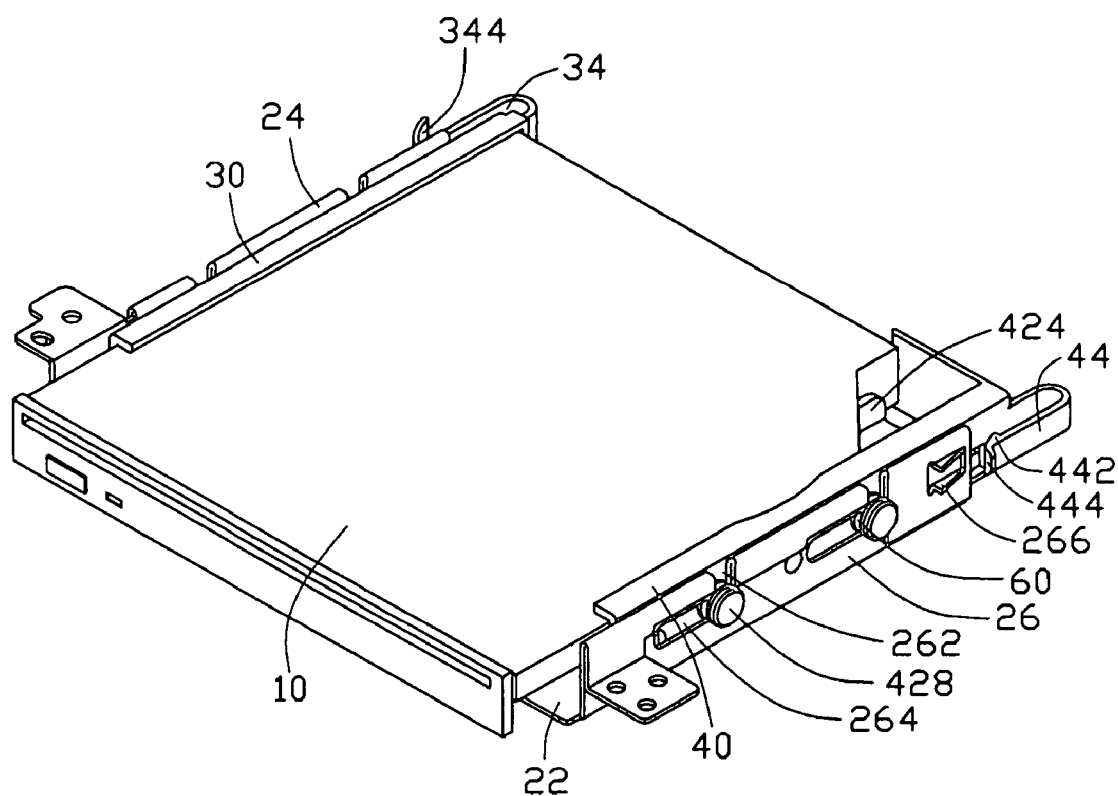
FIG. 4 is an assembled view of FIG. 1, showing the first and second rail members in an unlocked position.
Figure 5:
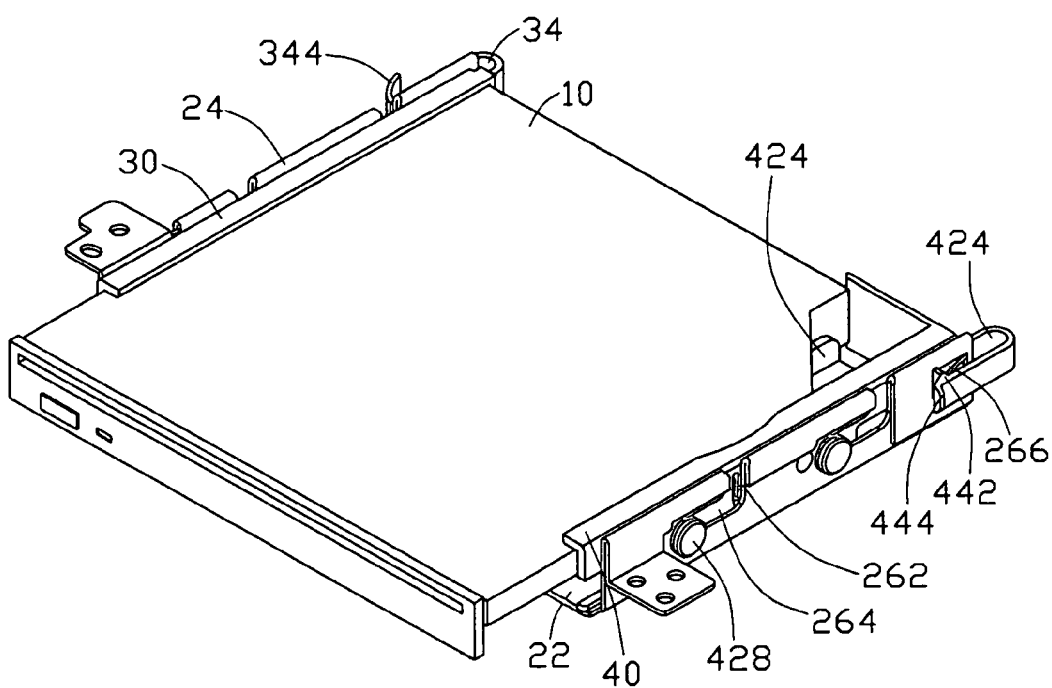
FIG. 5 is an assembled similar to FIG. 4, but showing the first and second rail members in a locked position.

Referring also to FIGS. 4 and 5, when assembling the data storage device 10 to the bracket 20, The combined first rail member 30, second rail member 40 and data storage device 10 is placed into the bracket 20 from a top. The posts 324, 428 of the first rail member 30 and second rail member 40 are put in the slots 241, 261 from the entry parts 242, 262. The combined assembly of the first rail member 30, second rail member 40 and data storage device 10 is pushed to make the posts 324, 428 slide in the horizontal parts 244, 264. The resilient tabs 326 of the first rail member 30 and second rail member 40 are received in the recesses 246 of the first side wall 24 and second side wall 26 of the bracket 20. The hook 342 of the first rail member 30 hooks the protrusion 266 of the first side wall 24 of the bracket 20 and the hook 442 of the second rail member 40 hooks the protrusion 266 of the second side wall 26 of the bracket 20. Thus, the data storage device 10 is secured in the bracket 20.

In disassembling the data storage device 10, the handle 344, 444 of the first rail member 30 and second rail member 40 are pulled. The hooks 342, 442 release the protrusions 266 of the first side wall 24 and second side wall 26 of the bracket 20. The posts 324, 428 move toward the entry parts 242, 262 of the slots 241, 261 of the bracket. The data storage device 10 can be drawn from the bracket 20.

In addition, a rubber gasket 60 can ring around each of the posts 324, 328 for achieving a good quakeproof function.

Figure 6:
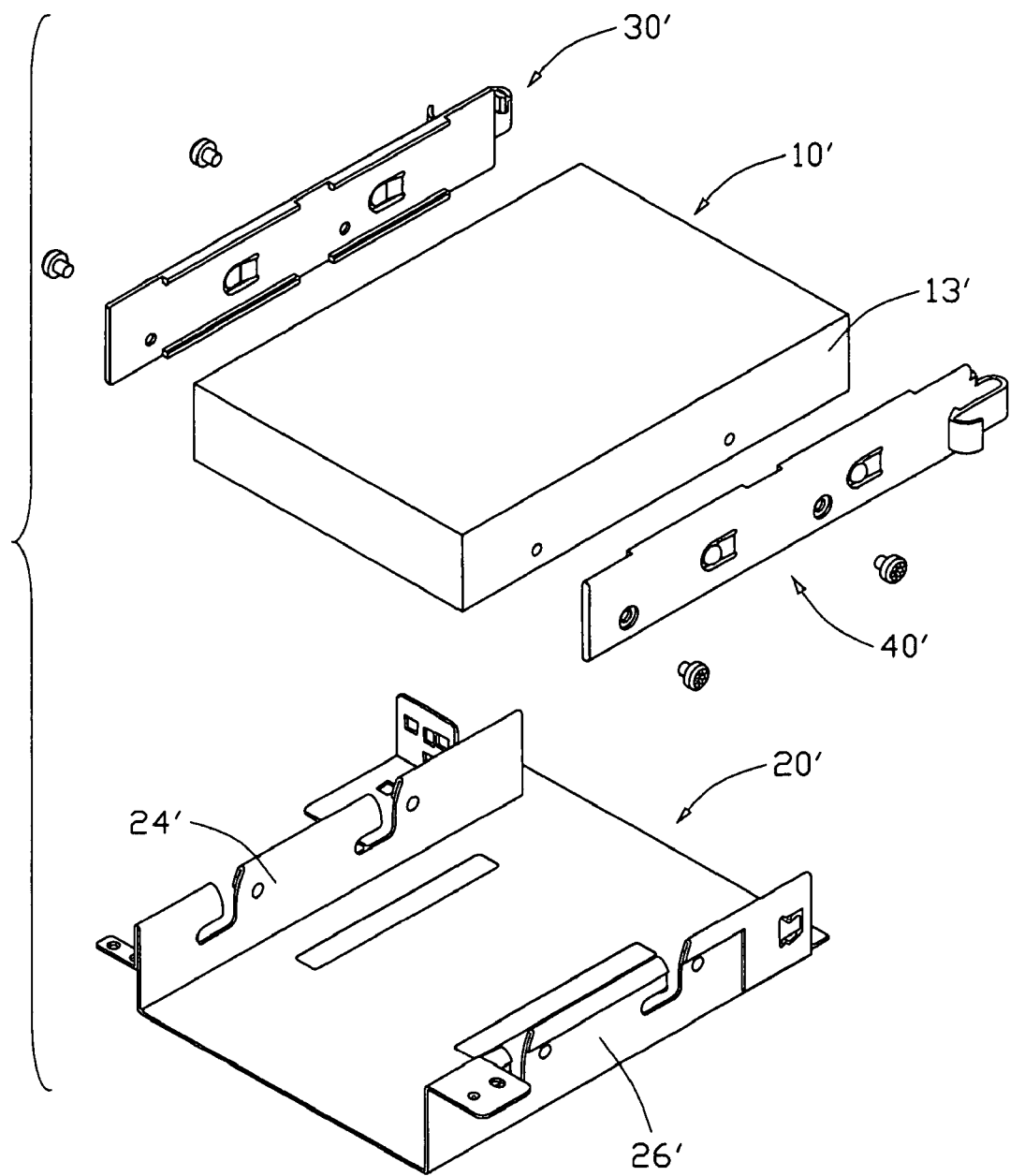
FIG. 6 is an isometric view of a mounting apparatus in accordance with an alternative embodiment of the present invention.
Figure 7:
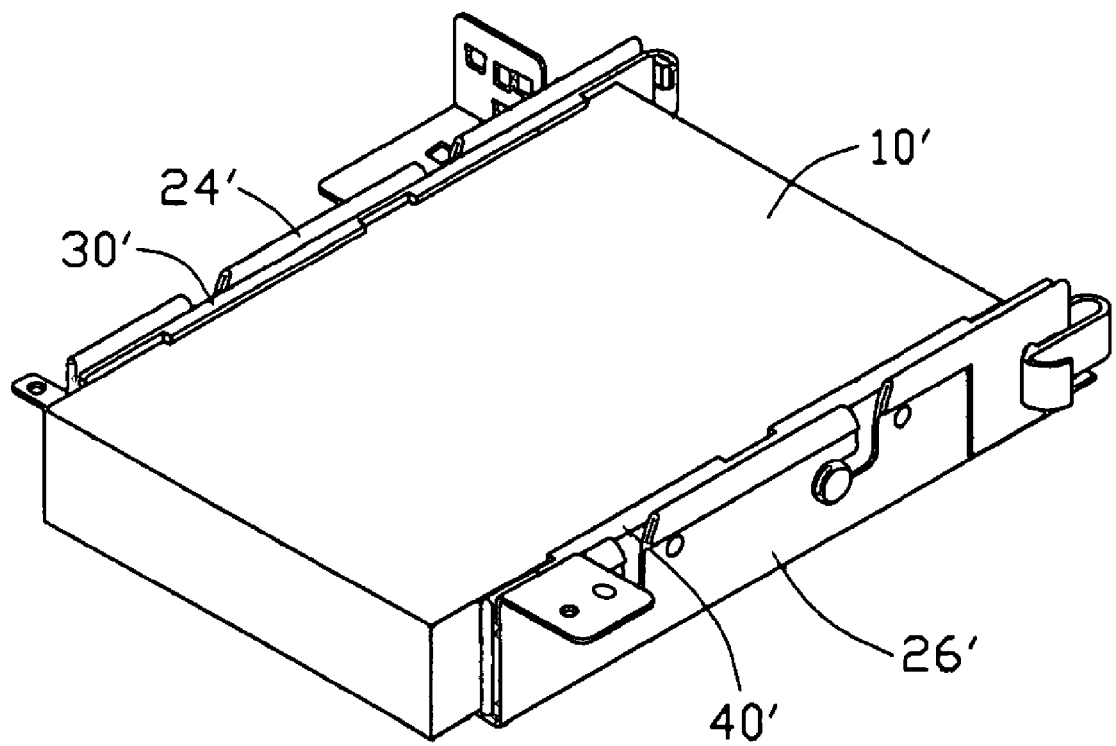
FIG. 7 is an assembled view of FIG. 6.

Referring FIGS. 6 and 7, in a second embodiment, a bracket 20' is approximately similar to the bracket 20 of the first embodiment. A first rail member 30' is similar to a second rail member 40'. A data storage device 10' comprises a continuous first sidewall (invisible) and a continuous second sidewall 13'.

The first and second rail members 30', 40' can be mounted to the first sidewall and second sidewall 13' of the data storage device 10' by a plurality of screws (not labeled). A head of each of the screws can stead the posts 324, 428 of the rail members. Meanwhile, a space between the slots of the first side wall 24' or second side wall 26' equals to a space of the two screws of the first and second rail member 30', 40'.

It is to be understood, however, that even though numerous characteristics and advantages of the present invention have been set fourth in the foregoing description, together with details of the structure and function of the invention, the disclosure is illustrative only, and changes may be made in detail, especially in matters of shape, size, and arrangement of parts within the principles of the invention to full extent indicated by the broad general meaning of the terms in which the appended claims are expressed.

What is claimed is:

1. A mounting apparatus for accommodating a data storage device therein, the mounting apparatus comprising:
    a bracket for receiving a data storage device therein, the bracket comprising two side walls, a pair of slots defined in each of the side walls, and a protrusion on at least one of the side walls protruding in a direction away from the data storage device; and
    a pair of rail members attached to both sidewalls of the data storage device, each of the rail members comprising a body, a pair of posts corresponding to the slots of the bracket protruding from the body, at least one of the rail members comprising a bending portion which is bent substantially 180 degrees back upon itself and a hook formed at a distal end of the bending portion corresponding to the protrusion of the bracket;
    wherein said posts are horizontally slidable in the slots of the bracket between a disengaged position where the posts are vertically movable relative to the bracket so as to disengage from the bracket, and an engaged position where the hook of the at least one of the rail members is engaged with the protrusion of the at least one of the side walls of the bracket, thereby the data storage device is secured in the bracket.

2. The mounting apparatus as described in claim 1, wherein loading of said data storage device to the bracket follows an L-shaped path, and wherein the hook is located outside of the corresponding side wall in a front-to-back direction when said data storage device is located at an entry position.

3. The mounting apparatus as described in claim 1, wherein each of the slots of the bracket comprises a vertical entry part and a horizontal sliding part.

4. The mounting apparatus as described in claim 1, wherein a rubber gasket rings around each of the posts of the rail members.

5. The mounting apparatus as described in claim 1, wherein a handle is bent outwardly from the distal end of the bending portion at an opposite side of the bending portion to the hook.

6. The mounting apparatus as described in claim 5, wherein the protrusion enters a space between the body and bending portion, and snappingly engages with the hook.

7. The mounting apparatus as described in claim 1, wherein a bent plate is bent from an upper edge of each of the side walls of the bracket, the protrusion is formed from the bent plate.

8. The mounting apparatus as described in claim 1, wherein each of the side walls of the bracket defines a recess therein, each of the rail members forms a resilient tab, a knob is formed from the resilient tab to engage in the recess.

9. A mounting apparatus for accommodating a data storage device therein, the mounting apparatus comprising:
    a bracket comprising two side walls, a slot defined in each of the side walls, an end of each of the slots exposed at a top edge of the corresponding side wall, a protrusion protruding from each of the side walls, a first locating means formed on each of the side walls; and
    a pair of rail members attached to both sidewalls of the data storage device, each of the rail members comprising a body and a hook formed at an end thereof, a post protruding from the body corresponding to the slot of the bracket, a second locating means formed on each of the rail members corresponding to the first locating means;

whereby said posts are slidable in the slots of the bracket along an up-to-down direction between a disengaged position and an engaged position where the hooks of the rail members hook the protrusions of the side walls of the bracket, and the first locating means engages with the second locating means.

10. The mounting apparatus as described in claim 9, wherein each of the slots of the bracket comprises a vertical entry part and a horizontal sliding part.

11. The mounting apparatus as described in claim 9, wherein a rubber gasket rings around each of the posts.

12. The mounting apparatus as described in claim 9, wherein each of the rail members comprises a body and a bending portion extending outwardly and then overlappingly bent from a distal end of the body, the hook protrudes inwardly from a distal end of the bending portion and a handle is bent outwardly from the distal end of the bending portion.

13. The mounting apparatus as described in claim 9, wherein the first locating means comprises a recess defined in each of the side walls of the bracket, the second locating means comprises a resilient tab stamped from each of the rail members, a knob is formed from the resilient tab to engage in the recess.

14. The mounting apparatus as described in claim 9, wherein loading of said data storage device to the bracket follows an L-shaped path, and wherein the hook is located outside of the corresponding side wall in a front-to-back direction when said data storage device is located at an entry position.

* * * * *